(12) United States Patent
Huang et al.

(10) Patent No.: US 12,238,985 B2
(45) Date of Patent: Feb. 25, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Yue Long, Beijing (CN); Weiyun Huang, Beijing (CN); Tianyi Cheng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 553 days.

(21) Appl. No.: 17/416,570

(22) PCT Filed: Oct. 19, 2020

(86) PCT No.: PCT/CN2020/121963
§ 371 (c)(1),
(2) Date: Jun. 21, 2021

(87) PCT Pub. No.: WO2022/082375
PCT Pub. Date: Apr. 28, 2022

(65) Prior Publication Data
US 2022/0328597 A1 Oct. 13, 2022

(51) Int. Cl.
*H10K 59/131* (2023.01)
*H10K 50/81* (2023.01)
*H10K 59/126* (2023.01)

(52) U.S. Cl.
CPC .......... *H10K 59/131* (2023.02); *H10K 50/81* (2023.02); *H10K 59/126* (2023.02)

(58) Field of Classification Search
CPC . H10K 59/35; H01L 27/3225; H01L 27/3227; H01L 27/3234; H01L 27/3244
See application file for complete search history.

(56) References Cited

U.S. PATENT DOCUMENTS

2020/0235191 A1 7/2020 Lee et al.
2021/0066409 A1* 3/2021 Fan ...................... H10K 59/131
(Continued)

FOREIGN PATENT DOCUMENTS

CN 110288945 A * 9/2019 ........... G09G 3/3225
CN 111653201 A 9/2020
(Continued)

*Primary Examiner* — Yuzhen Shen
(74) *Attorney, Agent, or Firm* — Lippes Mathias LLP

(57) ABSTRACT

Provided is a display substrate, including a first transparent display region, a second transparent display region and a non-transparent display region. The display substrate includes a plurality of first pixels disposed in an array in the first transparent display region and a plurality of second pixels. The first pixel includes a first light-emitting element and a first pixel circuit. The first pixel circuits in a same row are electrically connected to a same first gate line. The first pixel circuits in a same column are electrically connected to a same first data line. The second pixel includes a second light-emitting element disposed in the second transparent display region and a second pixel circuit disposed outside the first transparent display region and the second transparent display region. The second light-emitting element and the second pixel circuit are electrically connected by a transparent wire.

17 Claims, 9 Drawing Sheets

(56) References Cited

U.S. PATENT DOCUMENTS

| | | | |
|---|---|---|---|
| 2021/0066427 A1* | 3/2021 | Ma | H01L 27/156 |
| 2021/0296420 A1* | 9/2021 | Bok | H10K 59/121 |
| 2021/0405260 A1* | 12/2021 | He | G02B 1/10 |
| 2021/0408170 A1* | 12/2021 | Li | H10K 59/123 |
| 2021/0408194 A1* | 12/2021 | Zhang | H10K 59/126 |

FOREIGN PATENT DOCUMENTS

| | | |
|---|---|---|
| CN | 111725285 A | 9/2020 |
| CN | 111769148 A | 10/2020 |

\* cited by examiner

DISPLAY SUBSTRATE AND DISPLAY DEVICE

CROSS-REFERENCE TO RELATED APPLICATION

This application is a US national stage of international application No. PCT/CN2020/121963, filed on Oct. 19, 2020, the disclosure of which is herein incorporated by reference in its entirety.

TECHNICAL FIELD

The present disclosure relates to the field of displays, and in particular relates to a display substrate and a display device.

BACKGROUND

In a camera under display technology, a camera is disposed under a display screen. A region in which the camera is disposed is a transparent display region of the display screen. Pixels are arranged in the transparent display region. When the display screen displays a picture, the transparent display region also displays the picture, and the camera is invisible from the front surface of the display screen. The camera is hidden, such that the screen-to-body ratio of the display screen is increased.

SUMMARY

Embodiments of the present disclosure provide a display substrate and a display device. The technical solutions are as follows:

The present disclosure provides a display substrate. The display substrate includes a first transparent display region, a second transparent display region surrounding the first transparent display region, and a non-transparent display region surrounding the second transparent display region.

The display substrate further includes:
a plurality of first pixels disposed in an array in the first transparent display region, where the first pixel includes a first light-emitting element and a first pixel circuit electrically connected to the first light-emitting element, the first pixel circuits of the first pixels in a same row being electrically connected to a same first gate line, and the first pixel circuits of the first pixels in a same column being electrically connected to a same first data line; and
a plurality of second pixels, where the second pixel includes a second light-emitting element disposed in the second transparent display region and a second pixel circuit disposed outside the first transparent display region and the second transparent display region, the second light-emitting element and the second pixel circuit being electrically connected by a transparent connection line.

In some implementations of the present disclosure, the first gate line and the transparent connection line are disposed in different layers, and the first data line and the transparent connection line are disposed in different layers.

In some implementations of the embodiments of the present disclosure, a difference between a number of rows of the first pixels and a number of columns of the first pixels is between 0 and 2.

In some implementations of the present disclosure, the first gate line disposed in the second transparent display region is a transparent wire; and
the first data line disposed in the second transparent display region is a transparent wire.

In some implementations of the present disclosure, the display substrate further includes a non-display region surrounding the non-transparent display region, and the second pixel circuit is disposed in the non-display region.

In some implementations of the present disclosure, a ratio of an area of an orthographic projection of the first transparent display region onto a surface of the display substrate to a sum of the area of the orthographic projection of the first transparent display region onto the surface of the display substrate and an area of an orthographic projection of the second transparent display region onto the surface of the display substrate is less than or equal to 15%.

In some implementations of the present disclosure, the display substrate further includes:
a plurality of third pixels disposed in an array in the non-transparent display region, where the third pixel includes a third light-emitting element and a third pixel circuit electrically connected to the third light-emitting element, an area of an orthographic projection of the third pixel onto the surface of the display substrate being greater than an area of an orthographic projection of the first pixel onto the surface of the display substrate.

In some implementations of the present disclosure, a number of elements in the first pixel circuit is less than a number of elements in the third pixel circuit, or the first pixel circuit and third pixel circuit have a same circuit structure.

In some implementations of the present disclosure, the display substrate further includes a shielding structure disposed in the first transparent display region, where the shielding structure is configured to shield light passing through the first pixel circuits from a display surface of the display substrate.

In some implementations of the present disclosure, the shielding structure is a shielding layer disposed on a side, distal from the display surface of the display substrate, of the first light-emitting elements, and an orthographic projection of the first pixel circuit onto the surface of the display substrate falls within an orthographic projection of the shielding structure onto the surface of the display substrate.

In some implementations of the present disclosure, the shielding layer is a metal shielding layer.

In some implementations of the embodiments of the present disclosure, the shielding structure is an anode of the first light-emitting element.

In some implementations of the embodiments of the present disclosure, a plurality of transparent connection lines are disposed in different layers of the display substrate.

In some implementations of the embodiments of the present disclosure, a film layer in which the transparent connection lines are disposed is disposed on a first side of a thin-film transistor (TFT) array layer of the display substrate, the first side being a side, proximal to the display surface of the display substrate, of the TFT array layer.

In another aspect, embodiments of the present disclosure provide a display device, where the display device includes the display substrate in any foregoing aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In the related art, in an electronic device based on a camera under display technology, a camera is disposed in a transparent display region corresponding to a display substrate. Light-emitting elements of pixels in the transparent display region are respectively electrically connected to pixel circuits disposed outside the transparent display region by one transparent wire.

When there are a relatively large number of pixels in the transparent display region, a number of the transparent wires increases accordingly. However, it is difficult to wire the transparent wires due to a limited area of the transparent display region.

Figure 1:
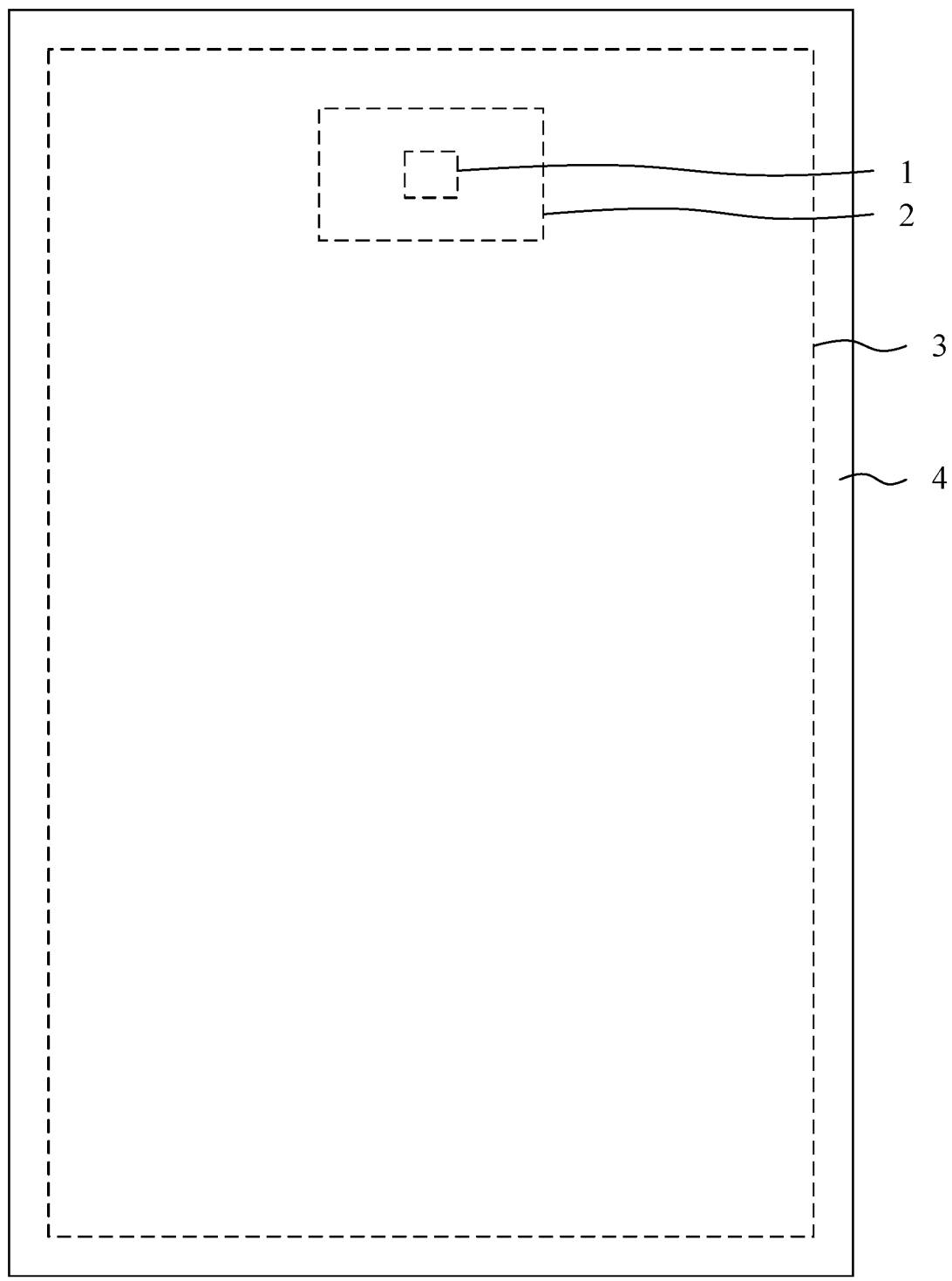
FIG. 1 is a top view of a display substrate according to an embodiment of the present disclosure.

FIG. 1 is a top view of a display substrate according to an embodiment of the present disclosure. Referring to FIG. 1, the display substrate includes a first transparent display region 1, a second transparent display region 2 surrounding the first transparent display region 1, and a non-transparent display region 3 surrounding the second transparent display region 2.

Figure 2:
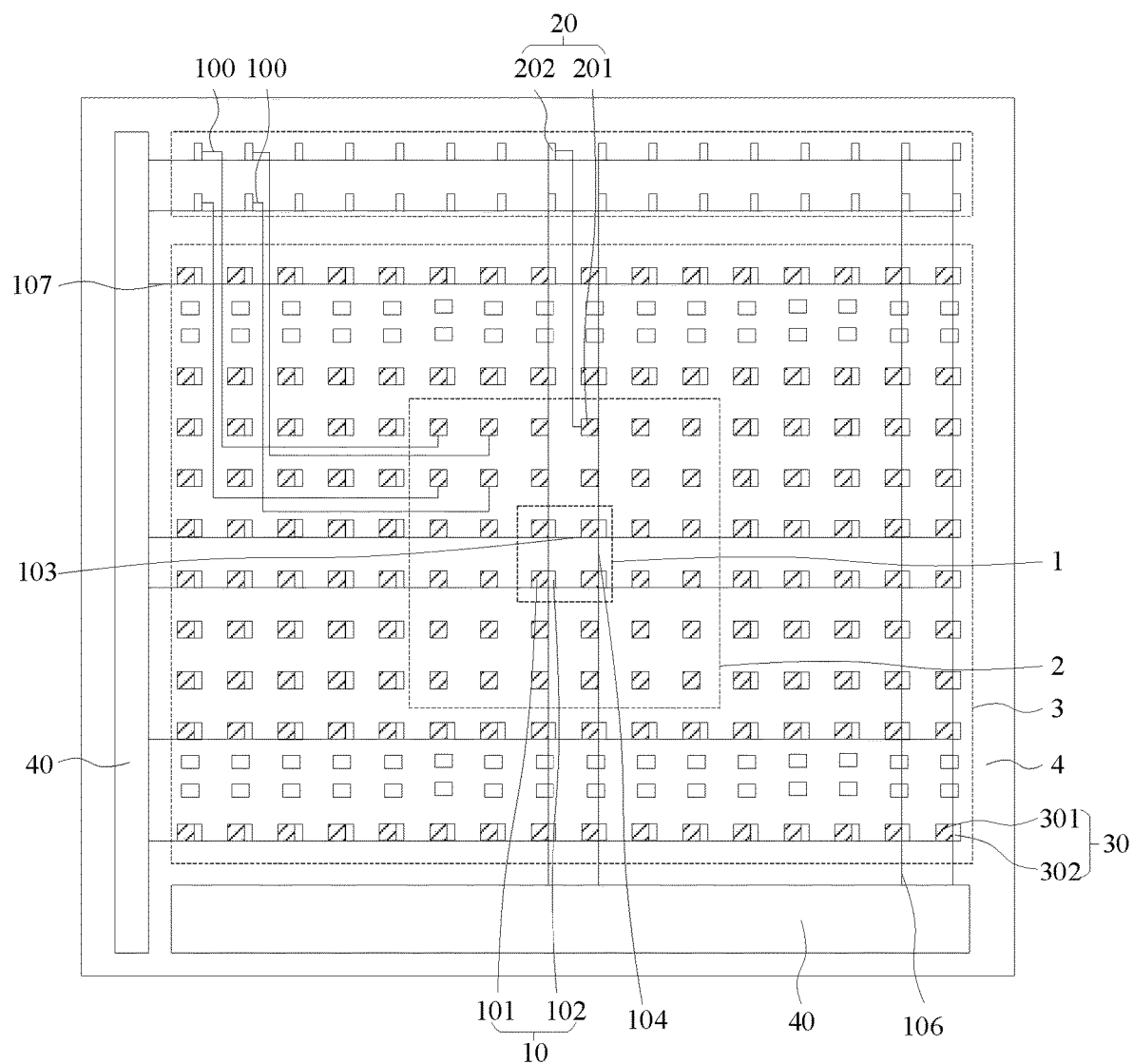
FIG. 2 is a distribution diagram of pixels in a display substrate according to an embodiment of the present disclosure.

FIG. 2 is a distribution diagram of pixels in a display substrate according to an embodiment of the present disclosure. Referring to FIG. 2, the display substrate includes a plurality of first pixels 10 and a plurality of second pixels 20. The plurality of first pixels 10 are disposed in an array in the first transparent display region 1. The first pixel 10 includes a first light-emitting element 101 and a first pixel circuit 102 electrically connected to the first light-emitting element 101. The first pixel circuits 102 of the first pixels 10 in a same row are electrically connected to a same first gate line 103. The first pixel circuits 102 of the first pixels 10 in a same column are electrically connected to a same first data line 104. The second pixel 20 includes a second light-emitting element 201 and a second pixel circuit 202. The second light-emitting elements 201 are disposed in the second transparent display region 2. The second pixel circuits 202 are disposed outside the first transparent display region 1 and the second transparent display region 2. The second light-emitting element 201 and the second pixel circuit 202 are electrically connected by a transparent connection line 100.

As shown in FIG. 1 and FIG. 2, the first transparent display region 1 and the second transparent display region 2 together form a transparent display region of a display panel, and the transparent display region is configured to arrange a camera. An orthographic projection of a lens of the camera onto the display substrate is a camera region. An orthographic projection of the first transparent display region 1 onto the display substrate falls within the camera region. The camera region is within the transparent display region.

In the embodiments of the present disclosure, the transparent display region represents that the display region has a certain transmittance, and light may travel through the region, such that the camera can normally form an image. For example, each of the first transparent display region 1 and the second transparent display region 2 has a certain transmittance.

In the embodiments of the present disclosure, the second pixel circuits 202 are disposed outside the first transparent display region 1 and the second transparent display region 2, and the first pixel circuits 102 are disposed in the first transparent display region 1. Since the region in which the pixel circuits are disposed has a lower transmittance, the transmittance of the second transparent display region 2 is greater than the transmittance of the first transparent display region 1.

In the embodiments of the present disclosure, the first pixel circuits and the first light-emitting elements are both disposed in the first transparent display region, and wires electrically connected between the first pixel circuits and the first light-emitting elements do not need to travel through the second transparent display region. In addition, scan signals are provided to the first pixel circuits of the first pixels in the same row through the same first gate line, and data signals are provided to the first pixel circuits of the first pixels in the same column through the same first data line. Therefore, a number of signal lines electrically connected to the first pixels in the first transparent display region is equal to a sum of a number of rows and a number of columns of the first pixels. A number of the transparent connection lines in the second transparent display region is equal to a number of second pixels. Therefore, the number of signal lines configured to control the light-emitting elements in the transparent display region is equal to a sum of the number of the first gate lines, the number of the first data lines, and the number of the transparent connection lines.

In a case that a fixed number of signal lines extend into the transparent display region from outside the first transparent display region and the second transparent display region, compared with controlling one pixel per signal line, the embodiments of the present disclosure can control more pixels with fewer signal lines, thereby improving a pixel density (pixels per inch, PPI) in the transparent display region, improving the resolution of the transparent display region, and improving a display effect of the transparent display region.

In a case that a fixed number of pixels are arranged in the transparent display region, compared with controlling one pixel per signal line, the embodiments of the present disclosure can reduce the number of signal lines configured to control the light-emitting elements in the transparent display region, thereby facilitating wiring.

In addition, the second transparent display region surrounds the first transparent display region, and the first transparent display region occupies relatively small space. Therefore, the first pixels in the first transparent display region have a lower impact on the imaging of the camera.

Optionally, the first transparent display region 1 and the second transparent display region 2 have the same pixel density, and the pixel density is less than or equal to a pixel density in the non-transparent display region 3.

As shown in FIG. 1 and FIG. 2, the display substrate further includes a non-display region 4 surrounding the non-transparent display region 3, and the second pixel circuits 202 are disposed in the non-display region 4. A region used for arranging the second pixel circuits 202 in the non-display region 4 may be referred to as a dummy pixel region.

Compared with that the second pixel circuits 202 are arranged in the non-transparent display region 3, the second pixel circuits 202 arranged in the non-display region 4 can be prevented from affecting the pixel density in the non-transparent display region 3. In addition, because the second light-emitting elements 201 and the second pixel circuits 202 are respectively disposed in different regions, the transparent connection line 100 extends from the non-display region 4 to the second transparent display region 2 to be electrically connected to the second light-emitting element 201.

For example, the transparent display region is configured to arrange the camera. The camera is usually disposed in the upper half portion of a display device. As shown in FIG. 1, the transparent display region formed by the first transparent display region 1 and the second transparent display region 2 is also disposed in the upper half portion of the display substrate.

As shown in FIG. 2, the second pixel circuits 202 are disposed in the upper half portion of the display substrate, such that the second pixel circuits 202 is closer to the second light-emitting element 201, and the length of the transparent connection line 100 can be shortened. In this way, the shielding of the transparent connection lines 100 to the camera can be reduced, and a voltage drop generated by the transparent connection lines 100 can be reduced, thereby improving the uniformity of signals.

It needs to be noted that in FIG. 2, in order to clearly show the distribution of pixels in the display substrate, not all electrical connection relationships between the second light-emitting elements 201 and the second pixel circuits 202 are shown. In practice, each second light-emitting element 201 is electrically connected to the second pixel circuit 202 by a corresponding transparent connection line 100.

In other implementations, the second pixel circuits 202 may be alternatively disposed in the non-transparent display region 3. In the implementation, a part of pixels, proximal to the second transparent display region 2, in the non-transparent display region 3 are disposed as dummy pixels. That is, the dummy pixel includes only the second pixel circuit 202 but does include the light-emitting element.

In the embodiments of the present disclosure, a difference between a number of rows of the first pixels 10 and a number of columns of the first pixels 10 is between 0 and 2.

The first pixel circuits 102 of the first pixels 10 in the same row are electrically connected to the same first gate line 103. The first pixel circuits 102 of the first pixels 10 in the same column are electrically connected to the same first data line 104. Therefore, a sum of a number of the first gate lines 103 and a number of the first data lines 104 is equal to a sum of the number of rows and the number of columns of the first pixels 10. By changing the arrangement of the first pixels 10, the sum of the number of rows and the number of columns of the first pixels 10 changes accordingly, thereby changing the sum of the number of the first gate lines 103 and the number of the first data lines 104. While a total number of the first pixels 10 remains unchanged, when the number of rows of the first pixels 10 is closer to the number of columns of the first pixels 10, the sum of the number of rows of the first pixels 10 and the number of columns of the first pixels 10 is smaller, and the sum of the number of the first gate lines 103 and the number of the first data lines 104 is smaller.

For example, the number of the first pixels 10 is 100. When the number of rows of the first pixels 10 and the number of columns of the first pixels 10 are both 10, the sum of the number of the first gate lines 103 and the number of the first data lines 104 is 20. When the number of rows of the first pixels 10 is 5 and the number of columns of the first pixels 10 is 20, the sum of the number of the first gate lines 103 and the number of the first data lines 104 is 25. When the number of rows of the first pixels 10 is 4 and the number of columns of the first pixels 10 is 25, the sum of the number of the first gate lines 103 and the number of the first data lines 104 is 29. As can be seen, when the number of rows of the first pixels 10 is closer to the number of columns of the first pixels 10, the sum of the number of rows of the first pixels 10 and the number of columns of the first pixels 10 is smaller.

It needs to be noted that in FIG. 2, to clearly show the first pixels 10 in the first transparent display region 1, only four first pixels 10 are shown. The number of the first pixels 10 may be set according to an actual practice.

For example, as shown in FIG. 2, the orthographic projection of the first transparent display region 1 onto the display substrate is a rectangle, and an orthographic projection of the second transparent display region 2 onto the display substrate is also a rectangle.

As shown in FIG. 2, the first transparent display region 1 is disposed in the middle of the second transparent display region 2. In other implementations, the first transparent display region 1 may be disposed at any position in the second transparent display region 2, and it is sufficient to ensure that at least two sides of the first transparent display region 1 are surrounded by the second transparent display region 2. For example, the first transparent display region 1 is disposed in the upper left of the second transparent display region 2.

In other implementations, outer contours of the orthographic projections of the first transparent display region 1 and the second transparent display region 2 onto the display substrate may be other shapes. For example, the outer contours of the orthographic projections of the first transparent display region 1 and the second transparent display region 2 onto the display substrate are both circles. This is not limited in the present disclosure.

The outer contours of the orthographic projections of the first transparent display region 1 and the second transparent display region 2 onto the display substrate may have the same shape or may have different shapes. This is not limited in the present disclosure.

In the embodiments of the present disclosure, the transparent connection line 100 is an indium tin oxide (ITO) wire.

ITO has better transparency, which can ensure the transparency of the transparent connection line. The transparent connection line 100 is configured to transmit electrical signals. ITO is electrically conductive, and may be configured to transmit electrical signals.

In the embodiments of the present disclosure, the transparent connection line 100 may be alternatively made of another highly transparent and electrically conductive material, for example, indium zinc oxide (IZO).

In the embodiments of the present disclosure, the first gate lines 103 disposed in the second transparent display region 2 are transparent wires, and the first data lines 104 disposed in the second transparent display region 2 are transparent wires. That is, in the embodiments of the present disclosure, the first gate line 103 includes three parts that are sequentially connected. The three parts are respectively disposed in the first transparent display region 1, the second transparent display region 2, and the non-transparent display region 3. The part, disposed in the second transparent display region 2, of the first gate line 103 is transparent, so as to avoid affecting the transmittance of the second transparent display region 2.

Referring to FIG. 1 again, the display substrate further includes a drive integrated circuit 40 disposed in the non-display region 4. The drive integrated circuit 40 provides scan signals to the first pixel circuits 102 of the first pixels 10 in the same row through one first gate line 103. In addition, the drive integrated circuit 40 provides data signals to the first pixel circuits 102 of the first pixels 10 in the same column through one first data line 104. Therefore, both the first gate lines 103 and the first data lines 104 need to travel through the second transparent display region 2. The first gate lines 103 disposed in the second transparent display region 2 and the first data line 104 disposed in the second transparent display region 2 are both set as transparent wires. Even if the first gate lines 103 and the first data lines 104 are densely wired since a larger number of first pixels 10 are arranged in the first transparent display region 1, the shielding of the first gate lines 103 and the first data lines 104 to the camera can also be reduced.

In the embodiments of the present disclosure, the first gate lines 103 disposed in the second transparent display region 2 and the first data lines 104 disposed in the second transparent display region 2 are both ITO wires.

ITO has better transparency, which can ensure the transparency of the first gate lines 103 and the first data lines 104. The first gate lines 103 and the first data lines 104 are configured to transmit electrical signals. ITO has electrical conductivity, and may be configured to transmit electrical signals.

In the embodiments of the present disclosure, the first gate lines 103 and the first data lines 104 that are disposed in the second transparent display region 2 may be alternatively made of another highly transparent and electrically conductive material, for example, IZO or the like.

In the embodiments of the present disclosure, the first gate lines 103 and the first data lines 104 may be made of the same material or may be made of different materials.

In the embodiments of the present disclosure, the first gate lines 103 disposed in the first transparent display region 1 and the non-transparent display region 3 may be transparent wires or may be opaque wires, and the first data lines 104 disposed in the first transparent display region 1 and the non-transparent display region 3 may be transparent wires or may be opaque wires.

For example, the first gate lines 103 and the first data lines 104 that are disposed in the first transparent display region 1 and the non-transparent display region 3 may be metal wires.

In the embodiments of the present disclosure, a ratio of an area of an orthographic projection of the first transparent display region 1 onto a surface of the display substrate to a sum of the area of the orthographic projection of the first transparent display region 1 onto the surface of the display substrate and an area of an orthographic projection of the second transparent display region 2 onto the surface of the display substrate is less than or equal to 15%.

In the first transparent display region 1, both the first light-emitting elements 101 and the first pixel circuits 102 are arranged, such that the first pixels 10 in the first transparent display region 1 occupy a larger area, and the first pixels 10 are not transparent. If the first transparent display region 1 occupies a larger area, the camera may be shielded, which results in affecting an imaging effect of the camera. In the embodiments of the present disclosure, the ratio of the area of the first transparent display region 1 to the area of the entire transparent region is limited, such that the area of the first transparent display region 1 is smaller. In this way, the shielding of the first transparent display region 1 to the camera can be effectively reduced.

In the embodiments of the present disclosure, the ratio of the first transparent display region 1 to the second transparent display region 2 may be adjusted in a simulation manner, such that the impact on imaging of the camera by the first transparent display region 1 is reduced while the arrangement is optimized.

Figure 3:
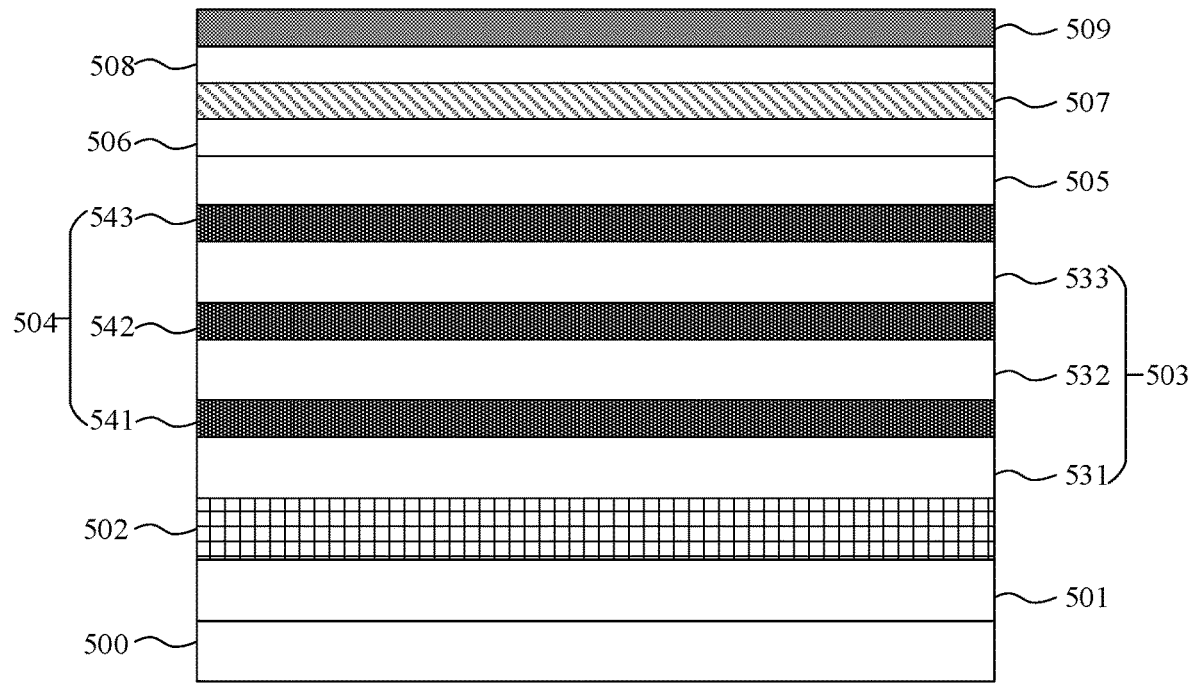
FIG. 3 is a schematic sectional view of a display substrate according to an embodiment of the present disclosure.

FIG. 3 is a schematic sectional view of a display substrate according to an embodiment of the present disclosure. Referring to FIG. 3, the display substrate includes a base substrate 500, a buffer layer 501, a thin film transistor (TFT) array layer 502, a passivation (PVX) layer 503, a wire layer 504, a first planarization (PLN) layer 505, a pixel definition layer (PDL) 506, a light-emitting element array layer 507, a second PLN layer 508, and an encapsulation layer 509 that are sequentially laminated.

In the embodiments of the present disclosure, the base substrate 500 provides support for the entire display substrate. The base substrate 500 is transparent, so as to ensure the transparency of the base substrate 500. For example, the base substrate 500 may be a glass substrate.

For example, the buffer layer 501 may be a resin layer.

A plurality of TFTs are arranged in the TFT array layer 502. Each pixel circuit includes a plurality of TFTs. The drive integrated circuit may control the light emission of pixels by the TFTs. The first gate lines 103 and the first data lines 104 are both disposed in the TFT array layer 502.

The PVX layer 503 separates the TFT array layer 502 from the wire layer 504, to prevent interference between the TFTs in the TFT array layer 502 and wires in the wire layer 504, which affects the transmission of electrical signals. The PVX layer 503 may be an inorganic PVX layer, for example, a silicon nitride (chemical formula: SiN) layer or a silicon oxynitride (chemical formula: SiON) layer, or may be an organic PVX layer, for example, an epoxy PVX layer. Silicon nitride and epoxy have adequate insulation performance, thereby ensuring the insulation performance of the PVX layer 503.

The wire layer 504 is configured to arrange the transparent connection lines 100. The wire layer 504 is an ITO layer.

The first PLN layer 505 is disposed between the PDL 506 and the wire layer 504. For example, the first PLN layer 505 may be a resin layer, a silicon-on-glass (SOG) layer or another organic film layer.

Grooves are provided in the PDL 506. The grooves are used for arranging light-emitting elements. The light-emitting elements emit light to enable the display substrate to display a picture.

The second PLN layer 508 enables the surface of the display substrate after the light-emitting element array layer 507 is formed to be more planar, thereby facilitating subsequent encapsulation, and in addition improving a display effect of the display panel. For example, the second PLN layer 508 may be a resin layer, an SOG layer or another organic film layer. The material of the first PLN layer 505 may be the same as or different from that of the second PLN layer 508.

The encapsulation layer 509 encapsulates the display substrate, so as to protect the internal structure of the display substrate.

For example, a thin-film encapsulation (TFE) method may be used for encapsulation, thereby ensuring an encapsulation effect.

In the embodiments of the present disclosure, the first gate lines 103 and the transparent connection lines 100 are disposed in different layers, and the first data lines 104 and the transparent connection lines 100 are disposed in different layers. When the first gate lines 103 and the transparent connection lines 100 are in different layers, it represents that the first gate lines 103 and the transparent connection lines 100 are not manufactured by using the same patterning process. Similarly, when the first data lines 104 and the transparent connection lines 100 are in different layers, it represents that the first data lines 104 and the transparent connection lines 100 are not manufactured by using the same patterning process.

Because both the first gate lines 103 and the first data lines 104 need to travel through the second transparent display region 2, the transparent connection lines 100 electrically connected to the second light-emitting element 201 and the second pixel circuit 202 also need to travel through the second transparent display region 2. If the first gate lines 103 and the first data lines 104 are both arranged in the same layer as the transparent connection lines 100, the first gate lines 103 and the first data lines 104 also occupy a part of an area of the second transparent display region 2. As a result, an area in which the transparent connection lines 100 can be arranged is reduced, which makes the wiring of the transparent connection lines 100 more difficult. The first gate lines 103 and the transparent connection lines 100 are arranged in different layers, and the first data lines 104 and the transparent connection lines 100 are also arranged in different layers, such that the transparent connection lines 100 may be arranged at positions where the first gate lines 103 and the first data lines 104 are originally arranged. That is, an area for arranging the transparent connection lines 100 is increased, which facilitates the arrangement of the transparent connection lines 100. Because the area for arranging the transparent connection lines 100 is increased, in a case that more second light-emitting elements 201 and second pixel circuits 202 are arranged, more transparent connection lines 100 may be arranged to electrically connect the second light-emitting element 201 and the second pixel circuit 202, such that a number of the second light-emitting elements 201 in the second transparent display region 2 is increased, that is, the resolution of the second transparent display region 2 is increased.

In the embodiments of the present disclosure, the plurality of transparent connection lines 100 are disposed in different layers of the display substrate.

Although the first gate lines 103 and the first data lines 104 are both arranged in different film layers from the transparent connection lines 100, when the number of the second light-emitting elements 201 in the second transparent display region 2 is increased, there are still a large number of transparent connection lines 100. If the plurality of transparent connection lines 100 are all arranged in the same layer, manufacturing is more difficult. Under the limitation of a manufacturing process, the line width of the transparent connection line 100 and the pitch in the transparent connection lines 100 cannot be small enough. Therefore, a number of the transparent connection lines 100 that can travel through the second transparent display region 2 is limited. The plurality of transparent connection lines 100 are arranged in different layers of the display substrate, so as to facilitate the arrangement of the transparent connection line 100, and in addition, a number of the transparent connection lines 100 in one layer is prevented from becoming excessively large, thereby preventing mutual contact between the transparent connection lines 100, to avoid affecting the transmission of electrical signals. In addition, because the transparent connection lines 100 are disposed in different film layers, a relatively large number of transparent connection lines 100 may be arranged, such that a relatively large number of second light-emitting elements 201 are arranged, thereby increasing the resolution of the second transparent display region 2.

In the embodiments of the present disclosure, when only one PVX layer 503 and one wire layer 504 are arranged in the display substrate, the PVX layer 503 and the wire layer 504 are laminated. When a plurality of PVX layers 503 and a plurality of wire layers 504 are arranged in the display substrate, the plurality of PVX layers 503 and the plurality of wire layers 504 are alternately laminated.

For example, in the embodiments of the present disclosure, there are a total of three wire layers for arranging the transparent connection lines 100, and the plurality of transparent connection lines 100 are evenly distributed in the three wire layers.

As shown in FIG. 3, the three wire layers are respectively a first wire layer 541, a second wire layer 542, and a third wire layer 543. The first wire layer 541 and the TFT array layer 502 are separated by a first PVX layer 531, the first wire layer 541 and the second wire layer 542 are separated by a second PVX layer 532, and the second wire layer 542 and the third wire layer 543 are separated by a third PVX layer 533, to avoid affecting the transmission of electrical signals.

In the embodiments of the present disclosure, the first PVX layer 531 is manufactured on the TFT array layer 502, the first wire layer 541 is then manufactured on the first PVX layer 531, and the first wire layer 541 is configured to arrange a part of the transparent connection lines 100. The second PVX layer 532 is then manufactured on the first wire layer 541, the second wire layer 542 is then manufactured on the second PVX layer 532, and the second wire layer 542 is configured to arrange a part of the transparent connection lines 100. The third PVX layer 533 is then manufactured on the second wire layer 542, the third wire layer 543 is then manufactured on the third PVX layer 533, and the third wire layer 543 is configured to arrange the last part of the transparent connection lines 100. A total of three wire layers are manufactured to arrange the transparent connection lines 100.

Referring to FIG. 2 again, the display substrate further includes: a plurality of third pixels 30. The plurality of third pixels 30 are distributed in an array in the non-transparent display region 3. The third pixel 30 includes a third light-emitting element 301 and a third pixel circuit 302 electrically connected to the third light-emitting element 301. An area of an orthographic projection of the third pixel 30 onto the surface of the display substrate is greater than an area of an orthographic projection of the first pixel 10 onto the surface of the display substrate.

The non-transparent display region 3 is a display region in which no camera is arranged. Because no camera needs to be arranged in the non-transparent display region 3, the third pixels 30 in the non-transparent display region 3 may be manufactured relatively large, thereby reducing manufacturing difficulty.

The area of the orthographic projection of the third pixel 30 onto the surface of the display substrate is a sum of areas of orthographic projections of the third light-emitting element 301 and the third pixel circuit 302 onto the surface of the display substrate. The area of the orthographic projection of the first pixel 10 onto the surface of the display substrate is a sum of areas of orthographic projections of the first light-emitting elements 101 and the first pixel circuits 102 onto the surface of the display substrate. When the area of the orthographic projection of the first pixel circuit 102 onto the surface of the display substrate is reduced, the size of the first pixel 10 can be reduced.

For example, the size of the first pixel circuit 102 may be reduced by reducing the sizes of a gate and a source drain in the first pixel circuit 102, for example, the length and width of the gate and the source drain being reduced, or by reducing the sizes of a gate line and a data line, for example, the line widths of the gate line and the data line being reduced.

Because the size of the first pixel circuit 102 is reduced, space in which no pixel circuit is arranged in the first transparent display region 1 is increased, such that the transmittance of the first transparent display region 1 can be increased.

As shown in FIG. 2, the third pixel circuit 302 and the second pixel circuit 202 are both electrically connected to the drive integrated circuit 40 by the data line and the gate line.

As shown in FIG. 2, a part of the third pixel circuits 302 are disposed in the same row or the same column as the first pixel circuits 102, and a part of the third pixel circuits 302 are disposed in different rows and disposed in different columns from the first pixel circuits 102.

The first pixel circuits 102 and the third pixel circuits 302 disposed in the same row are electrically connected to the same gate line. In this case, the third pixel circuit 302 is electrically connected to a part, disposed in the non-transparent display region 3, of the first gate line 103. The first pixel circuits 102 and the third pixel circuits 302 disposed in the same column are electrically connected to the same data line. In this case, the third pixel circuit 302 is electrically connected to a part, disposed in the non-display region 3, of the first data line 104.

For the third pixel circuits 302 that are neither in the same row nor the same column as the first pixel circuits 102, the third pixel circuits 302 disposed in the same row are electrically connected to a same second gate line 107, and the third pixel circuits 302 disposed in the same column are electrically connected to a same second data line 106.

Referring to FIG. 2 again, a part of the second pixel circuits 202 are disposed in the same column as the first pixel circuits 102, and a part of the second pixel circuits 202 are electrically connected to a part, disposed in the non-display region 4, of the corresponding first data line 104. Another part of the second pixel circuits 202 and the first pixel circuits 102 are disposed in different columns. Another part of the second pixel circuits 202 are electrically connected to a part, disposed in the non-display region 4, of the corresponding second data line 106.

In the embodiments of the present disclosure, the structure of the second pixel circuit 202 is the same as that of the third pixel circuit 302.

Figure 4:
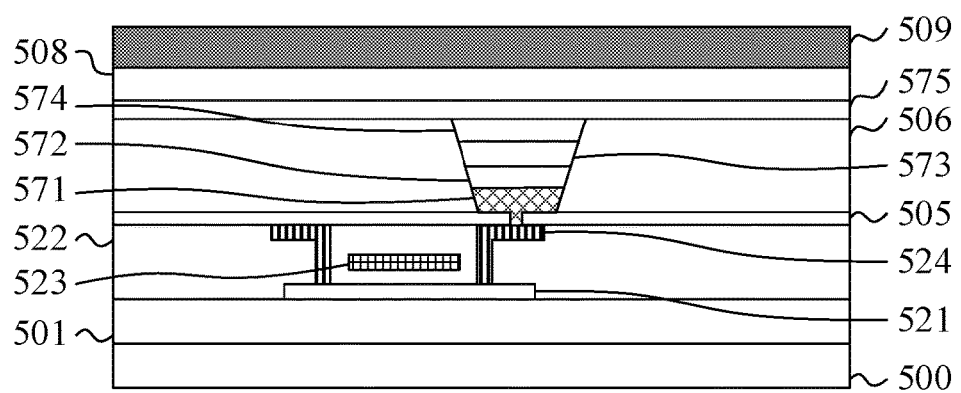
FIG. 4 is a schematic sectional view of a third pixel according to an embodiment of the present disclosure.

FIG. 4 is a schematic sectional view of a third pixel according to an embodiment of the present disclosure. Referring to FIG. 4, the TFT array layer 502 includes an active (Act) layer 521, a gate insulator (GI) layer 522, a gate layer 523, and a source drain (SD) layer 524 that are sequentially laminated.

In the embodiments of the present disclosure, the GI layer 522 is disposed between the Act layer 521 and the gate layer 523, and the GI layer 522 separates the Act layer 521 from the gate layer 523, to ensure that the Act layer 521 and the gate layer 523 are separated from each other and can independently transmit signals.

For example, the GI layer 522 may be an inorganic insulating layer, for example, a silicon nitride (SiN) layer or a silicon oxynitride (SiON) layer, or may be an organic insulating layer, for example, an epoxy insulating layer. Silicon nitride and epoxy have adequate insulation performance, so as to ensure the insulation performance of the GI layer 522.

Because the third pixel circuits are disposed in the non-transparent display region 3, the gate layer 523 and the SD layer 524 in the third pixel circuits may be ITO layers, or may be metal layers, for example, copper (Cu) layers. That is, in the non-transparent display region 3, and the gate layer 523 and the SD layer 524 may be opaque.

FIG. 4 shows a top-gate TFT structure. Apart from the TFT structure shown in FIG. 4, TFT may be alternatively a bottom-gate TFT structure or a dual-gate TFT structure. In another structure, the TFT may further include two gate layers 523 or two SD layers 523. When there are two gate layers 523, correspondingly two GI layers 522 are also provided. When there are two SD layers 523, an inter-layer dielectric (ILD) layer may be alternatively disposed between the two SD layers.

As shown in FIG. 4, the PDL 506 is configured to separate various subpixels of an organic light-emitting display (OLED) from each other. That is, the PDL 506 forms a plurality of subpixel regions in the display region 2 by using its own groove structures. Light-emitting elements are formed in the grooves of the PDL 506. The light-emitting element includes an anode layer 571, a hole transmission layer 572, an organic light-emitting layer 573, and an electron transmission layer 574 that are disposed in the grooves of the PDL 506 and a cathode layer 575 shared by the pixels. The anode layer 571, the hole transmission layer 572, the organic light-emitting layer 573, and the electron transmission layer 574 in one groove and the cathode layer 575 shared by the pixels form one organic light-emitting element.

In some implementations of the embodiments of the present disclosure, a number of elements in the first pixel circuit 102 is less than a number of elements in the third pixel circuit 302.

Because the first pixel circuits 102 are disposed in the first transparent display region 1, the number of elements in the first pixel circuit 102 is reduced, such that the size of the first pixel circuit 102 can be reduced, thereby reducing the shielding of the camera by the first pixels 10. When the number of elements in the first pixel circuit 102 is less than the number of elements in the third pixel circuit 302, making it convenient to manufacture the first pixel circuits 102 smaller, thereby reducing the shielding of the camera by the first pixels 10. For example, the third pixel circuit 302 is a 7T1C (seven TFTs and one capacitor) structure, and the first pixel circuit 102 is a 2T1C structure.

In some other implementations of the embodiments of the present disclosure, a circuit structure of the first pixel circuit 102 is the same as a circuit structure of the third pixel circuit 302. In this case, when the number of elements in the first pixel circuit 102 is equal to the number of elements in the third pixel circuit 302, the structure of the first pixel circuit 102 is the same as that of the third pixel circuit 302, to facilitate manufacturing. In addition, the uniformity of a display effect of the display region can be increased.

For example, the third pixel circuit 302 is a 7T1C structure, and the first pixel circuit 102 is also a 7T1C structure.

Figure 5:
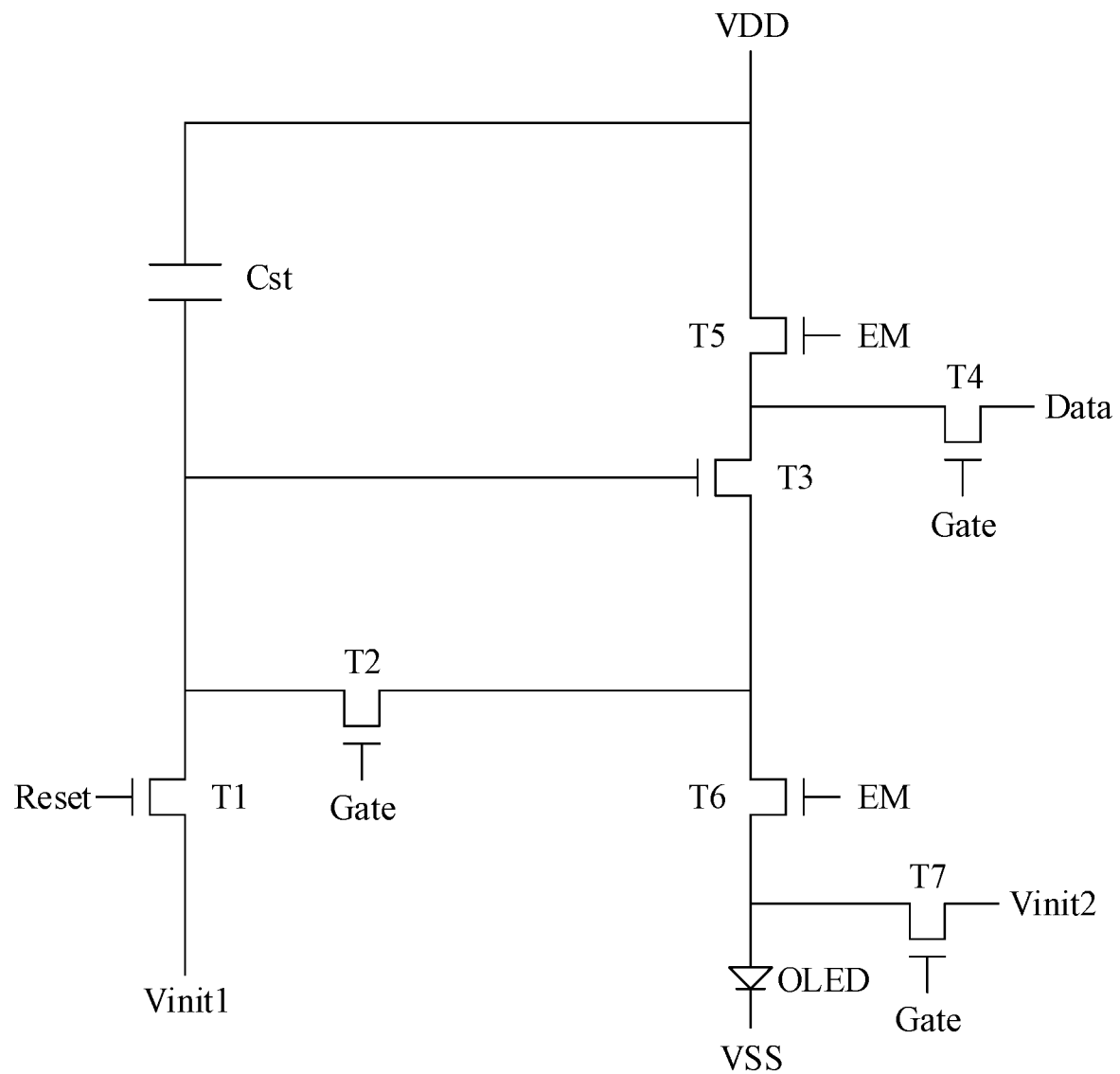
FIG. 5 is a structural circuit diagram of a pixel circuit according to an embodiment of the present disclosure.

FIG. 5 is a structural circuit diagram of a pixel circuit according to an embodiment of the present disclosure. Referring to FIG. 5, Data is a data input terminal, Reset is a reset signal terminal, Gate is a scan signal terminal, EM is a light-emitting control signal terminal, Vinit is an initialized voltage, VDD is a first voltage signal terminal, and VSS is a second voltage signal terminal. The first voltage signal terminal VDD is configured to provide a first voltage signal, the second voltage signal terminal VSS is configured to provide a second voltage signal, and the first voltage signal is a high-level signal relative to the second voltage signal. T3 is a drive transistor, and T4 is a switch transistor. A gate of T1 is electrically connected to the reset signal terminal, a source of T1 is electrically connected to a first initialized voltage (Vinit1), and a drain of T1 is respectively electrically connected to a drain of T2 and a gate of T3, and is at the same time electrically connected to one electrode plate of a capacitor Cst. A gate of T2 is electrically connected to the scan signal terminal, and a source of T2 is electrically connected to a drain of T3 and a source of T6. A drain of T4 is electrically connected to a source of T3 and a drain of T5, a source of T4 is electrically connected to the data input terminal, and a gate of T4 is electrically connected to the scan signal terminal. A source of T5 is electrically connected to the other electrode plate of the capacitor Cst, and is at the same time electrically connected to the first voltage signal terminal, and a gate of T5 is electrically connected to the light-emitting control signal terminal. A gate of T6 is electrically connected to the light-emitting control signal terminal, a drain of T6 is electrically connected to a drain of T7, and is at the same time electrically connected to one end of an organic light-emitting diode (OLED), the other end of the OLED is electrically connected to the second voltage signal terminal, a source of T7 is electrically connected to a second initialized voltage (Vinit2), and a gate of T7 is electrically connected to the scan signal terminal.

Figure 6:
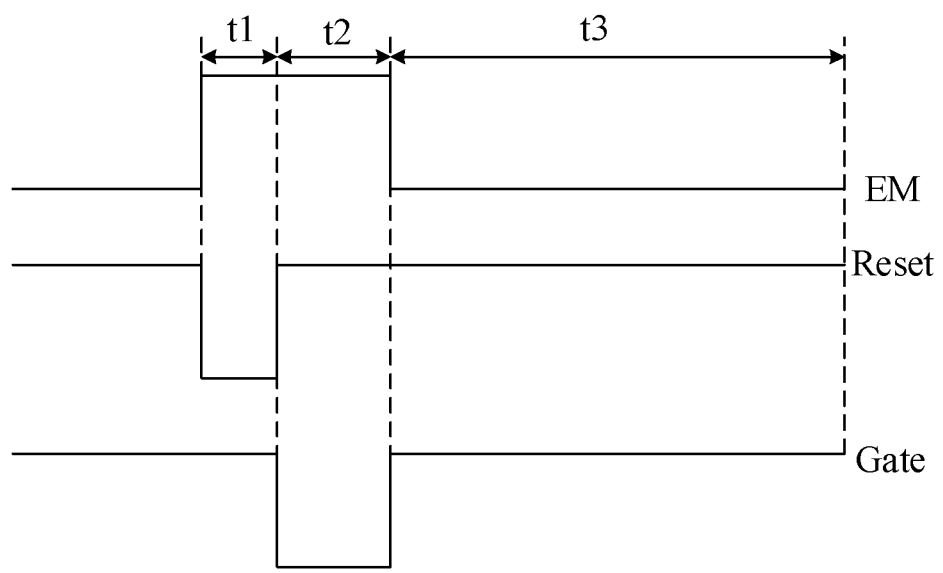
FIG. 6 is a timing diagram of a pixel circuit according to an embodiment of the present disclosure.

FIG. 6 is a timing diagram of a pixel circuit according to an embodiment of the present disclosure. Referring to FIG. 6, in a reset phase t1, T1 is turned on, and the gate of T3 is reset to Vinit1. In a data write phase t2, T2, T4, and T7 are turned on, a data signal is written to the source of T4, the data signal travels through T3 and T2, and the capacitor Cst is charged, such that a voltage at the gate of T3 turns to Vdata. T5 and T6 are both turned on at a low level, and there is a high level in both the reset phase t1 and the data write phase t2. Therefore, in the reset phase t1 and the write phase t2, T5 and T6 are both turned off, and the OLED does not emit light. In a light-emitting phase t3, low level signals are inputted into T5 and T6, T5 and T6 are turned on, and the OLED emits light.

In the embodiments of the present disclosure, the structure of the first pixel circuit 102 can be simplified by using an external compensation method, thereby reducing the size of the first pixel circuit 102, such that the shielding of the camera by the first pixel circuit 102 is reduced, and it is ensured at the same time that the first pixel circuits 102 can provide a sufficient voltage.

In the embodiments of the present disclosure, a region in which the second pixel circuits 202 are disposed may be divided into a plurality of first subregions, and a region in which the second light-emitting elements 201 are disposed is divided into a plurality of second subregions that correspond one to one to the first subregions. A number of the second pixel circuits 202 in one first subregion is equal to a number of the second light-emitting elements 201 in one second subregion. The second pixel circuits 202 in one first subregion are electrically connected in a one-to-one correspondence to the corresponding second light-emitting elements 201 in the second subregions.

Figure 7:
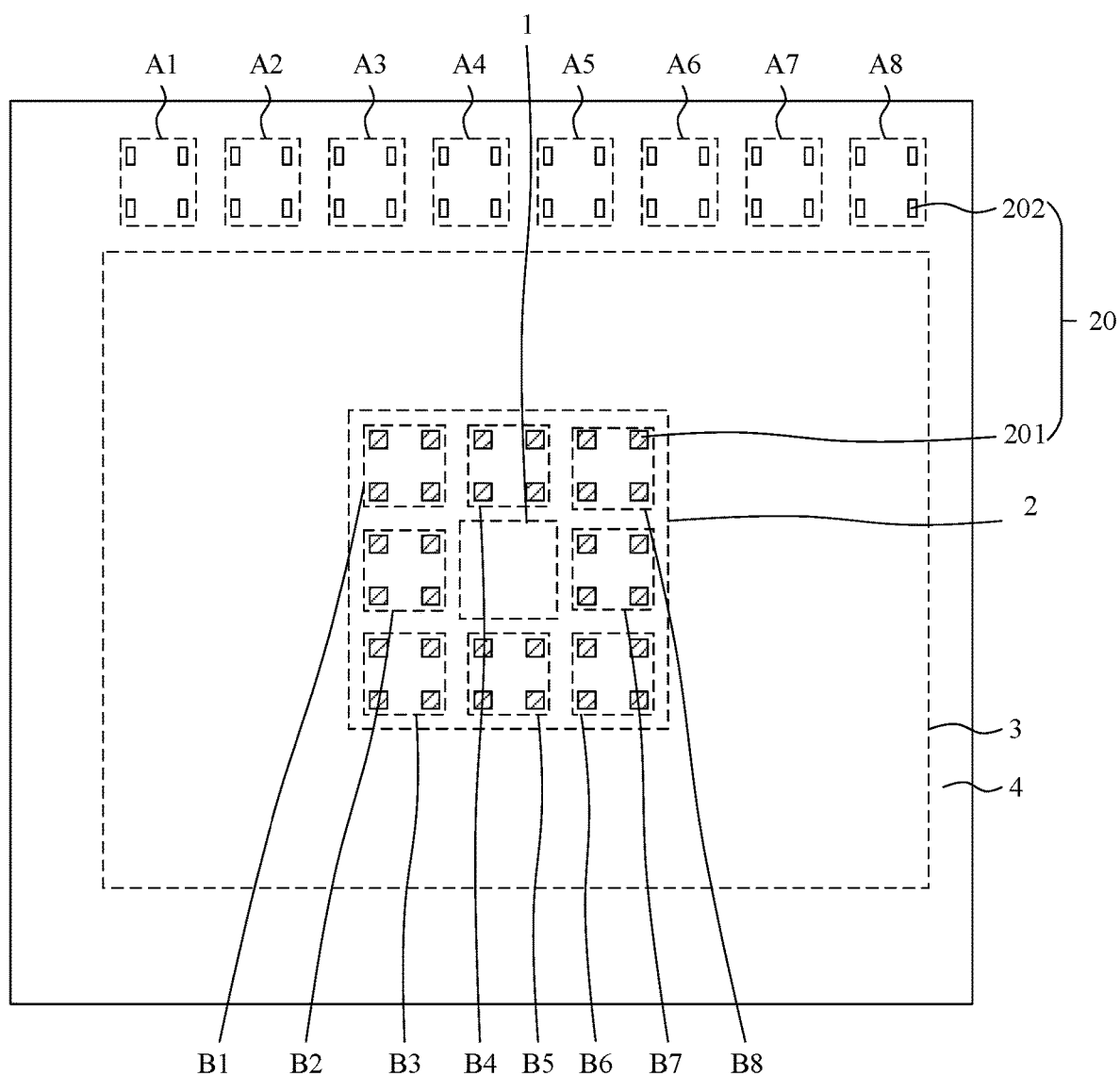
FIG. 7 is a distribution diagram of second pixels according to an embodiment of the present disclosure.

FIG. 7 is a distribution diagram of second pixels according to an embodiment of the present disclosure. Referring to FIG. 7, the second pixel circuits 202 disposed above the display substrate may be divided into eight regions, namely, A1, A2, A3, A4, A5, A6, A7, and A8. The second light-emitting elements 201 surrounding the first transparent display region 1 may also be divided into eight regions, namely, B1, B2, B3, B4, B5, B6, B7, and B8. The second pixel circuits 202 in the region A1 are electrically connected to the second light-emitting elements 201 in B1, the second pixel circuits 202 in the region A2 are electrically connected to the second light-emitting elements 201 in B2, the second pixel circuits 202 in the region A3 are electrically connected to the second light-emitting elements 201 in B3, the second pixel circuits 202 in the region A4 are electrically connected to the second light-emitting elements 201 in B4, the second pixel circuits 202 in the region A5 are electrically connected to the second light-emitting elements 201 in B5, the second pixel circuits 202 in the region A6 are electrically connected to the second light-emitting elements 201 in B6, the second pixel circuits 202 in the region A7 are electrically connected to the second light-emitting elements 201 in B7, and the second pixel circuits 202 in the region A8 are electrically connected to the second light-emitting elements 201 in B8.

In FIG. 7, to clearly show the second light-emitting elements 201 and the second pixel circuits 202, the pixels and wires in other regions are all omitted.

The division of regions in FIG. 7 is only an example. The region in which the second pixel circuits 202 are disposed and the region in which the second light-emitting elements 201 are disposed may be divided according to an actual case.

Figure 8:
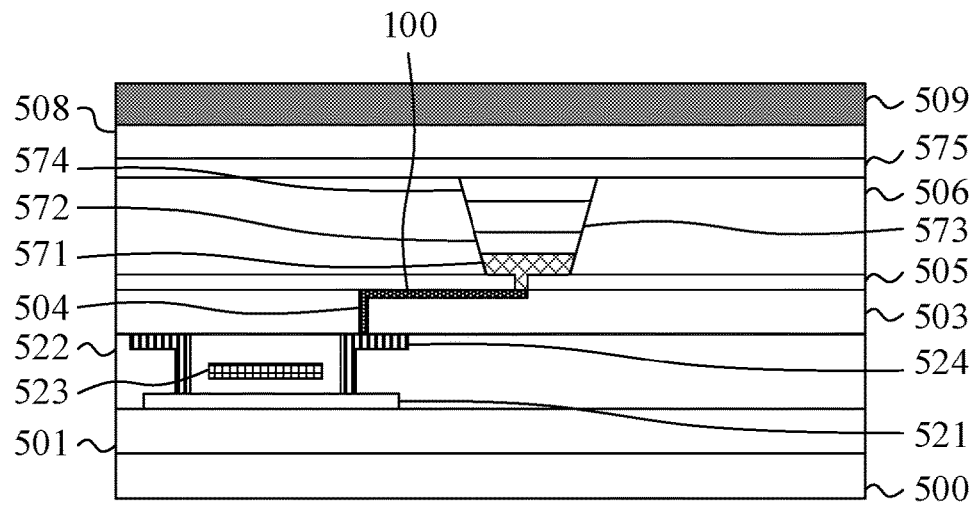
FIG. 8 is a schematic sectional view of a second pixel according to an embodiment of the present disclosure.

FIG. 8 is a schematic sectional view of a second pixel according to an embodiment of the present disclosure. Referring to FIG. 8, the second light-emitting element 201 is electrically connected to the second pixel circuit 202 by the transparent connection line 100 in the wire layer 504.

Only one PVX layer 503 and one wire layer 504 are arranged in the second pixels shown in FIG. 8.

Figure 9:
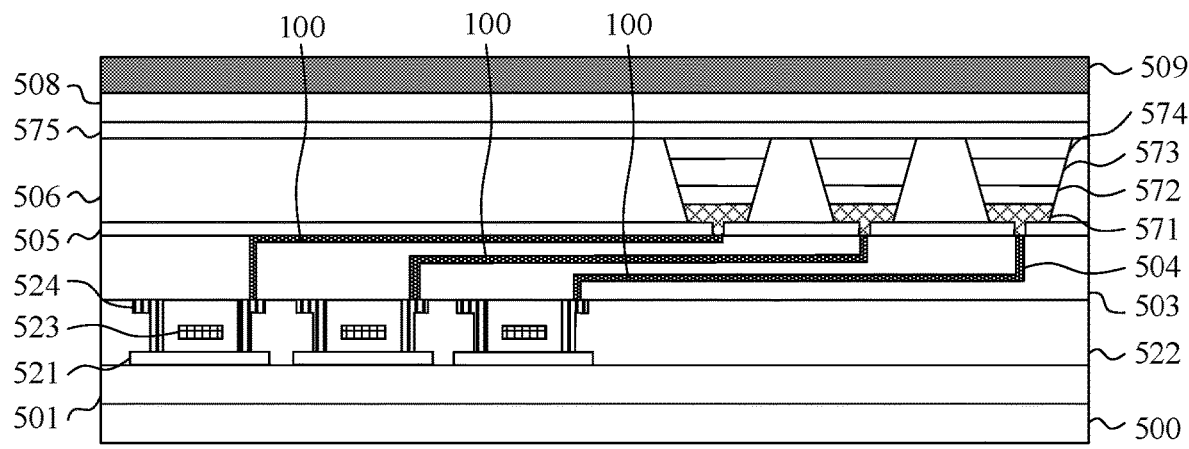
FIG. 9 is a schematic sectional view of another second pixel according to an embodiment of the present disclosure.

FIG. 9 is a schematic sectional view of a second pixel according to an embodiment of the present disclosure. Referring to FIG. 9, only three PVX layers 503 and three wire layers 504 are arranged in the second pixels. Each second pixel circuit 202 is electrically connected to one second light-emitting element 201 by a corresponding transparent connection line 100.

As shown in FIG. 8 and FIG. 9, the transparent connection lines 100 are disposed on the TFT array layer 502. A film layer in which the transparent connection lines 100 are disposed is disposed on a first side of the TFT array layer 502 of the display substrate, and the first side is a side, proximal to a display surface of the display substrate, of the TFT array layer 502. For example, the transparent connection lines 100 are disposed above the SD layer 524 of the TFT array layer 502. That is, a distance between the film layer in which the transparent connection lines 100 are disposed and the surface of the base substrate 500 is greater than a distance between the SD layer 524 and the surface of the base substrate 500.

In the embodiments of the present disclosure, the TFT is a TFT with a bottom-gate structure, and the transparent connection lines 100 are arranged on the SD layer. That is, the transparent connection lines 100 are neither in the same layer as the gate layer 523 nor the SD layer 524. Therefore, the transparent connection lines 100 are neither in the same layer as the first gate lines 103 nor the first data lines 104, which facilitates wire arrangement.

Figure 10:
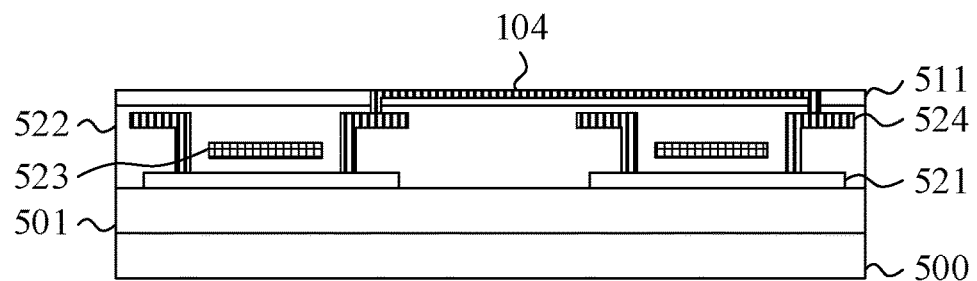
FIG. 10 is a schematic connection diagram of a first pixel circuit according to an embodiment of the present disclosure.

FIG. 10 is a schematic connection diagram of a first pixel circuit according to an embodiment of the present disclosure. Referring to FIG. 10, the third pixel circuit 302 is shown on the left side in FIG. 10, and the first pixel circuit 102 is disposed on the right side in FIG. 10. The first data line 104 travels through a fourth PVX layer 511 disposed on the TFT array layer 502 to be electrically connected to the first pixel circuit 102 and the third pixel circuit 302. The third pixel circuit 302 travels through the second gate line to be electrically connected to the drive integrated circuit 40.

FIG. 10 shows an arrangement manner of the first data lines 104. Similarly, the same arrangement manner may be used for the first gate lines 103. That is, the first gate lines 103 are arranged in the fourth PVX layer 511.

FIG. 10 is only to show the arrangement manner of the first data lines 104, and the film layer on the fourth PVX layer 511 is omitted.

Figure 11:
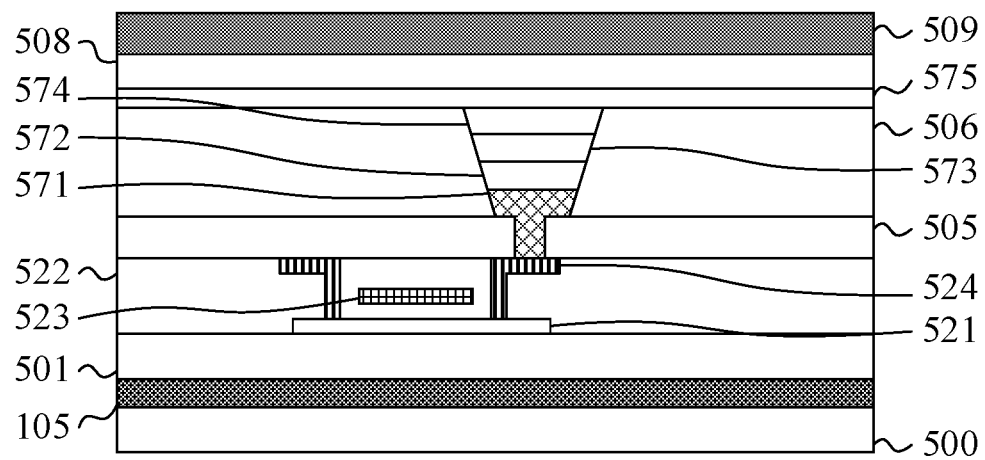
FIG. 11 is a schematic sectional view of a first pixel according to an embodiment of the present disclosure.

FIG. 11 is a schematic sectional view of a first pixel according to an embodiment of the present disclosure. Referring to FIG. 11, the first pixels 10 is provided with a shielding structure 105 for shielding the first pixel circuits 102. The shielding structure 105 is disposed below the first light-emitting elements 101, that is, disposed on a side, distal from the display surface of the display substrate, of the first light-emitting elements 101. A projection of the first pixel circuit 102 onto the surface of the display substrate is at least partially overlapped with a projection of the shielding structure 105 onto the surface of the display substrate. That is, an orthographic projection of the first pixel circuit 102 onto the surface of the display substrate and an orthographic projection of the shielding structure 105 onto the surface of the display substrate partially overlap. Alternatively, the orthographic projection of the first pixel circuit 102 onto the surface of the display substrate is completely overlapped with an orthographic projection of the shielding structure 105 onto the surface of the display substrate.

A plurality of first pixels 10 are arranged at intervals, and there are gaps between the plurality of first pixels 10. During photographing of the camera, a diffraction phenomenon occurs at gaps between the plurality of first pixels 10, which may affect an imaging effect of the camera. The shielding structure 105 is manufactured in the first pixels 10. The shielding structure 105 is disposed between the first pixel circuits 102 and a light-emitting layer of the first light-emitting elements 101. The shielding structure 105 shields the first pixel circuits 102. In addition, the shielding structure 105 also shields the gaps in the first pixel circuits 102. The diffraction phenomenon at the gaps is prevented from affecting the imaging effect of the camera. The shielding structure 105 is to shield light that enters the camera through the gaps, the shielding structure 105 can shield the light that enters the camera through the gaps, and in addition does not affect light emission of the light-emitting layer. Therefore, the shielding structure 105 is disposed below the first light-emitting elements 101.

In some implementations of the embodiments of the present disclosure, a shielding layer is an integral structure, and the integral structure is disposed in the entire first transparent display region 1. The shielding layer is configured to shield the plurality of first pixel circuits 102 in the first transparent display region 1.

Figure 12:
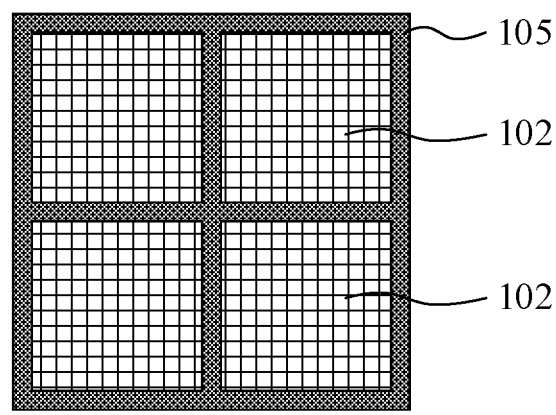
FIG. 12 is a top view of a first pixel according to an embodiment of the present disclosure.

FIG. 12 is a top view of a first pixel according to an embodiment of the present disclosure. Referring to FIG. 12, the shielding layer is an integral structure. Orthographic projections of the first pixel circuits 102 onto the shielding layer are all disposed in the shielding layer. The integral structure can shield gaps between the elements in the first pixel circuit 102, and can further shield gaps between adjacent first pixel circuits 102, thereby reducing the impact of the diffraction phenomenon on the imaging effect of the camera.

For example, the shielding structure 105 is opaque, and can shield gaps between the first pixel circuits 102, thereby reducing the impact on the imaging effect of the camera.

In some implementations of the embodiments of the present disclosure, the shielding structure 105 is a shielding layer, and in a direction perpendicular to the surface of the display substrate, the shielding layer is disposed between the base substrate 500 and the buffer layer 501, as shown in FIG. 11.

Figure 13:
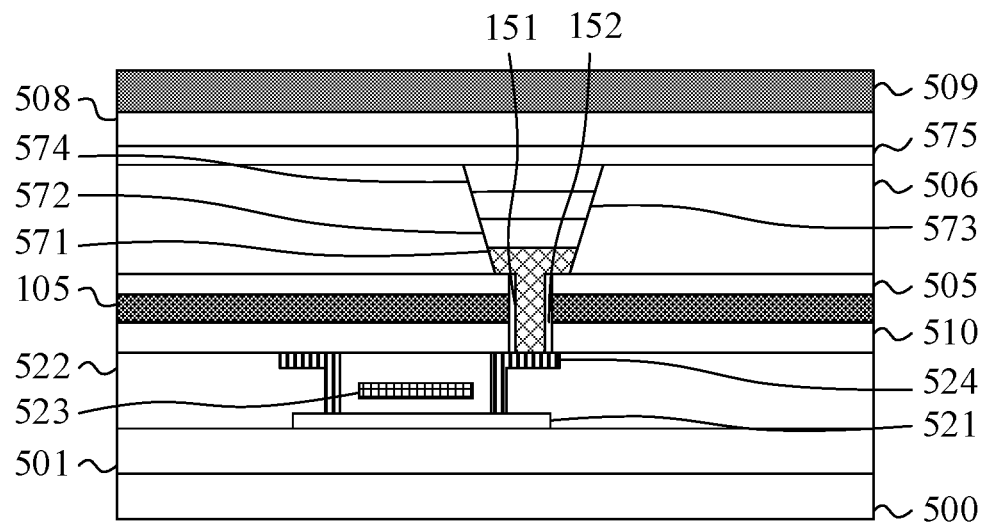
FIG. 13 is a schematic sectional view of another first pixel according to an embodiment of the present disclosure.

In some other implementations of the embodiments of the present disclosure, the shielding layer is disposed between the first light-emitting elements 101 and the first pixel circuits 102 in the first pixels 10. FIG. 13 is a schematic sectional view of a first pixel according to an embodiment of the present disclosure. As shown in FIG. 13, in this case, a fifth PVX layer 510 is arranged between the shielding structure 105 and the TFT array layer 502.

As shown in FIG. 13, a plurality of openings are provided in the shielding structure 105. A via 151 is provided in each opening. The via 151 passes through the shielding structure 105 and the fifth PVX layer 510. An anode of the first light-emitting element 101 passes through the via 151 to be electrically connected to the first pixel circuit.

In some implementations of the embodiments of the present disclosure, the shielding layer is a metal shielding layer. Metal has low costs, and facilitates manufacturing. In other implementations, the shielding layer may be alternatively another opaque material.

As shown in FIG. 13, when the shielding layer is a metal shielding layer, an insulating material 152 is arranged on an inner side wall of the openings, to prevent a plurality of first pixel circuits 102 from being electrically connected by the metal shielding layer, thereby avoiding affecting the transmission of electrical signals.

Alternatively, in other implementations, the shielding layer includes a plurality of shielding regions, and each shielding region shields one first pixel circuit 102.

Figure 14:
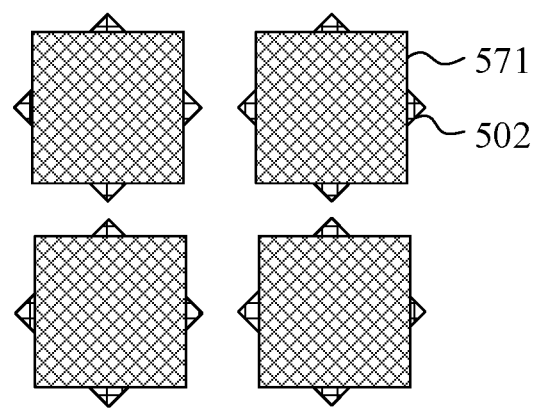
FIG. 14 is a top view of another first pixel according to an embodiment of the present disclosure.

FIG. 14 is a top view of a first pixel according to an embodiment of the present disclosure. The shielding structure 105 is an anode of the first light-emitting element 101.

Because the anode layer 571 is opaque, the anode of the first light-emitting element 101 is opaque. The anode of the first light-emitting element 101 may be manufactured larger, and the first pixel circuits 102 are arranged below the first light-emitting elements 101, the anode shields the first pixel circuits 102, and no process steps need to be added, thereby facilitating manufacturing.

Figure 15:
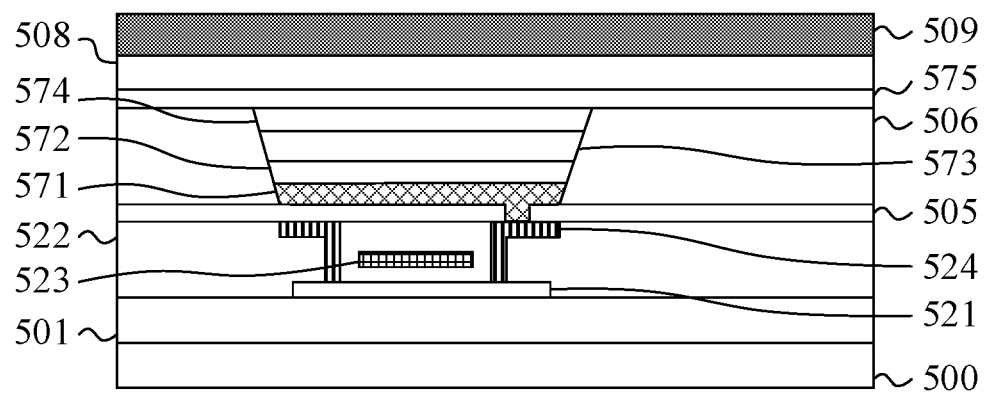
FIG. 15 is a schematic sectional view of still another first pixel according to an embodiment of the present disclosure.

FIG. 15 is a schematic sectional view of a first pixel according to an embodiment of the present disclosure. Referring to FIG. 15, the first pixel circuits 102 are disposed below the anode layer 571.

For example, the projection of the first pixel circuit 102 onto the surface of the display substrate is at least partially overlapped with a projection of the anode of the first light-emitting element 101 onto the surface of the display substrate.

The first pixel circuit 102 is arranged below the anode of the first light-emitting element 101. The anode of the first light-emitting element 101 shields the gaps between the elements of the first pixel circuit 102, to prevent a diffraction phenomenon from the gaps between the elements of the first pixel circuit 102, thereby avoiding affecting the imaging effect of the camera.

Embodiments of the present disclosure further provide a display device. The display device includes the display substrate shown in any foregoing drawing.

During specific implementation, the display apparatus provided in the embodiments of the present disclosure may be a mobile phone, a tablet computer, a television, a display, a notebook computer, a digital frame, a navigator or any other product or component having a display function.

The foregoing is merely optional embodiments of the present disclosure but is not used to limit the present disclosure. Any changes, equivalent replacements, and improvements made within the spirit and principle of the present disclosure shall fall within the protection scope of the present disclosure.

What is claimed is:

1. A display substrate, comprising a first transparent display region, a second transparent display region surrounding the first transparent display region and a non-transparent display region surrounding the second transparent display region; wherein
   the display substrate further comprises:
      a plurality of first pixels disposed in an array in the first transparent display region, wherein the first pixel comprises a first light-emitting element and a first pixel circuit electrically connected to the first light-emitting element, the first pixel circuits of the first pixels in a same row being electrically connected to a same first gate line, and the first pixel circuits of the first pixels in a same column being electrically connected to a same first data line;
      a plurality of second pixels, wherein the second pixel comprises a second light-emitting element disposed in the second transparent display region and a second pixel circuit disposed outside the first transparent display region and the second transparent display region, the second light-emitting element and the second pixel circuit being electrically connected by a transparent connection line; and
      a shielding structure, wherein the shielding structure is an integral structure, which is entirely disposed in the first transparent display region and between the first pixel circuit and the first light-emitting element, the shielding structure being configured to shield light passing through the first pixel circuits from a display surface of the display substrate;
   and wherein the first gate line and the transparent connection line are disposed in different layers, the first data line and the transparent connection line are disposed in different layers, and a plurality of transparent connection lines are disposed in different layers of the display substrate.

2. The display substrate according to claim 1, wherein a difference between a number of rows of the first pixels and a number of columns of the first pixels is between 0 and 2.

3. The display substrate according to claim 2, wherein the first gate line disposed in the second transparent display region is a transparent wire; and
   the first data line disposed in the second transparent display region is a transparent wire.

4. The display substrate according to claim 1, further comprising a non-display region surrounding the non-transparent display region, wherein the second pixel circuit is disposed in the non-display region.

5. The display substrate according to claim 1, wherein a ratio of an area of an orthographic projection of the first transparent display region onto a surface of the display substrate to a sum of the area of the orthographic projection of the first transparent display region onto the surface of the display substrate and an area of an orthographic projection of the second transparent display region onto the surface of the display substrate is less than or equal to 15%.

6. The display substrate according to claim 1, further comprising:
   a plurality of third pixels disposed in an array in the non-transparent display region, wherein the third pixel comprises a third light-emitting element and a third pixel circuit electrically connected to the third light-emitting element, an area of an orthographic projection of the third pixel onto a surface of the display substrate being greater than an area of an orthographic projection of the first pixel onto the surface of the display substrate.

7. The display substrate according to claim 6, wherein a number of elements in the first pixel circuit is less than a number of elements in the third pixel circuit, or the first pixel circuit and the third pixel circuit have a same circuit structure.

8. The display substrate according to claim 1, wherein the shielding structure is a shielding layer disposed on a side, distal from the display surface of the display substrate, of the first light-emitting elements, and an orthographic projection of the first pixel circuit onto the surface of the display substrate falls within an orthographic projection of the shielding structure onto the surface of the display substrate.

9. The display substrate according to claim 8, wherein the shielding layer is a metal shielding layer.

10. The display substrate according to claim 1, wherein a film layer in which the transparent connection lines are disposed is disposed on a first side of a thin-film transistor (TFT) array layer of the display substrate, the first side being a side, proximal to the display surface of the display substrate, of the TFT array layer.

11. The display substrate according to claim 1, wherein the display substrate is provided with a plurality of passivation layers and a plurality of wire layers, the plurality of passivation layers and the plurality of wire layers are alternately laminated, and the plurality of transparent connection lines are evenly distributed in the plurality of wire layers.

12. The display substrate according to claim 1, wherein a region in which the second pixel circuits are disposed is divided into a plurality of first subregions, and a region in which the second light-emitting elements are disposed is divided into a plurality of second subregions that correspond one to one to the plurality of first subregions, wherein the second pixel circuit in each first subregion of the plurality of first subregions is electrically connected to the second light-emitting element in the second subregion corresponding to the first subregion.

13. A display device, wherein the display device comprises a display substrate comprising a first transparent display region, a second transparent display region surrounding the first transparent display region and a non-transparent display region surrounding the second transparent display region; wherein the display substrate further comprises:
- a plurality of first pixels disposed in an array in the first transparent display region, wherein the first pixel comprises a first light-emitting element and a first pixel circuit electrically connected to the first light-emitting element, the first pixel circuits of the first pixels in a same row being electrically connected to a same first gate line, and the first pixel circuits of the first pixels in a same column being electrically connected to a same first data line;
- a plurality of second pixels, wherein the second pixel comprises a second light-emitting element disposed in the second transparent display region and a second pixel circuit disposed outside the first transparent display region and the second transparent display region, the second light-emitting element and the second pixel circuit being electrically connected by a transparent connection line; and
- a shielding structure, wherein the shielding structure is an integral structure, which is entirely disposed in the first transparent display region and between the first pixel circuit and the first light-emitting element, the shielding structure being configured to shield light passing through the first pixel circuits from a display surface of the display substrate;

and wherein the first gate line and the transparent connection line are disposed in different layers, the first data line and the transparent connection line are disposed in different layers, and a plurality of transparent connection lines are disposed in different layers of the display substrate.

14. The display device according to claim 13, wherein a difference between a number of rows of the first pixels and a number of columns of the first pixels is between 0 and 2.

15. The display device according to claim 13, wherein the first gate line disposed in the second transparent display region is a transparent wire; and
the first data line disposed in the second transparent display region is a transparent wire.

16. The display device according to claim 13, wherein the display substrate further comprises a non-display region surrounding the non-transparent display region, the second pixel circuit being disposed in the non-display region.

17. The display device according to claim 13, wherein a ratio of an area of an orthographic projection of the first transparent display region onto a surface of the display substrate to a sum of the area of the orthographic projection of the first transparent display region onto the surface of the display substrate and an area of an orthographic projection of the second transparent display region onto the surface of the display substrate is less than or equal to 15%.

* * * * *